(12) United States Patent
Sarma et al.

(10) Patent No.: US 7,713,824 B2
(45) Date of Patent: May 11, 2010

(54) SMALL FEATURE INTEGRATED CIRCUIT FABRICATION

(75) Inventors: Chandrasekhar Sarma, Poughkeepsie, NY (US); Alois Gutmann, Poughkeepsie, NY (US); Sajan Marokkey, Wappingers Falls, NY (US); Josef Maynollo, Villach (AT)

(73) Assignee: Infineon Technologies North America Corp., San Jose, CA (US)

( * ) Notice: Subject to any disclaimer, the term of this patent is extended or adjusted under 35 U.S.C. 154(b) by 498 days.

(21) Appl. No.: 11/677,206

(22) Filed: Feb. 21, 2007

(65) Prior Publication Data

US 2008/0199784 A1      Aug. 21, 2008

(51) Int. Cl.
*H01L 21/8236* (2006.01)
*H01L 21/00* (2006.01)

(52) U.S. Cl. .............. 438/278; 438/5; 257/E21.475; 257/E21.495

(58) Field of Classification Search ............... 438/278, 438/5; 257/E21.475, E21.495
See application file for complete search history.

(56) References Cited

U.S. PATENT DOCUMENTS

| 2002/0142232 A1 | 10/2002 | Kling et al. ............. 438/585 |
| 2003/0066038 A1 | 4/2003 | Ma et al. ................. 716/2 |
| 2005/0191832 A1 | 9/2005 | Huang et al. ........... 438/585 |
| 2006/0019179 A1* | 1/2006 | Leunissen et al. ......... 430/5 |

\* cited by examiner

*Primary Examiner*—David S Blum
(74) *Attorney, Agent, or Firm*—Saul Ewing LLP

(57) ABSTRACT

A method for controlling etching during photolithography in the fabrication of an integrated circuit in connection with first and second features that are formed on the integrated circuit having a gap there between comprising depositing a layer of photoresist on the integrated circuit, selectively exposing portions of the photoresist through at least one photolithography mask having a pattern including means for alleviating line end shortening of the first and second lines adjacent the gap, and developing the photoresist after the selective exposing step.

12 Claims, 4 Drawing Sheets

SMALL FEATURE INTEGRATED CIRCUIT FABRICATION

BACKGROUND OF THE INVENTION

The invention pertains to semiconductor fabrication. More particularly, the invention pertains to patterning of small features in integrated circuits.

As the designs of semiconductor circuitry become smaller, problems with the limitations and tolerances of the optical systems used in photolithography become more prevalent, especially with regards to the etching of small features.

For example, the problem of line end shortening (LES) is primarily the result of the limitations of the optics used in photolithography. Particularly, LES generally refers to the problem wherein a line of photoresist to be formed on a substrate ends up being shorter than what was intended by the design, e.g., shorter than the corresponding line on the mask. This is due largely to the fact that the amount of photoresist that is exposed through the mask to light generally will not exactly match that dictated by the mask due to diffraction of light around the edges between the opaque regions and the transparent regions of the mask and due to complex interactions between nearby features (commonly known as proximity effects). Aspects of line end shortening include corner rounding, wherein corners of the line become rounded, and overall line end shortening.

The issue of line end shortening is particularly relevant to the fabrication of gates in SRAM (Static Random Access Memory) transistors. Specifically, the material (typically polysilicon) deposited on a semiconductor to form the gate electrode of a transistor in a SRAM is generally called a line. With reference to exemplary FIG. 1, which shows a small portion of a SRAM integrated circuit, typically, a plurality of lines 112a, 112b, 112c of different transistors are straight, coaxial with each other, and are separated from each other by small gaps 114a, 114b. Furthermore, the lines 112 usually are perpendicularly intersected by other lines 116 (which, in this case, refer to shallow trench level isolation). The common area between 116 and 112 define the active area of a transistor. As SRAM transistors become smaller and more densely packed, the line tip to tip distances, i.e., the gaps 114, between the coaxial lines 112, become smaller.

For any given transistor design, there is a minimum amount of overhang 118 that must be maintained in order to prevent leakage between the gate, source and drain of the transistor. Also, there must be a minimum gap 114 between the ends of the lines 112 between adjacent transistors in order to prevent leakage between the adjacent transistors.

Accordingly, line end shortening is a particular problem with respect to the fabrication of SRAMs because it often is important to maintain a minimum overhang 118 and a minimum line end to line end spacing (hereinafter tip to tip gap) 114, while simultaneously making the tip to tip gap as small as possible in order to pack the transistors as tightly together as possible.

Several solutions have been proposed to address the line end shortening problem. In one such solution, the mask is designed with longer lines than desired based on the assumption that line end shortening will occur. However, as the tip to tip gap becomes smaller, this solution becomes less than optimal. Particularly, the lines on the mask can only be lengthened to a limited extent because the adjacent coaxial mask lines cannot meet as there would no longer be a gap between the line ends in the mask.

Furthermore, the amount of line end shortening and corner rounding that can occur can only be determined within a certain tolerance, and thus this solution can only be taken so far. Furthermore, the features on the mask themselves (e.g., the lengths of the lines on the mask) can be produced only to certain tolerances. Further, due to the limitations of the optics, any error in the mask can generally be expected to be magnified up to about six fold, and sometimes even more, when transferred to the semiconductor through photolithography.

SUMMARY OF THE INVENTION

A method for controlling patterning during photolithography in the fabrication of an integrated circuit in connection with first and second features that are formed on the integrated circuit having a gap here between comprising depositing a layer of photoresist on the integrated circuit, selectively exposing portions of the photoresist through at least one photolithography mask having a pattern including means for alleviating line end shortening of the first and second lines adjacent the gap, and developing the photoresist after the selective exposing step.

DETAILED DESCRIPTION OF THE INVENTION

In accordance with an exemplary first embodiment of the present invention, the task of patterning the photoresist for creating lines is divided between two photolithography masks.

Figure 1:
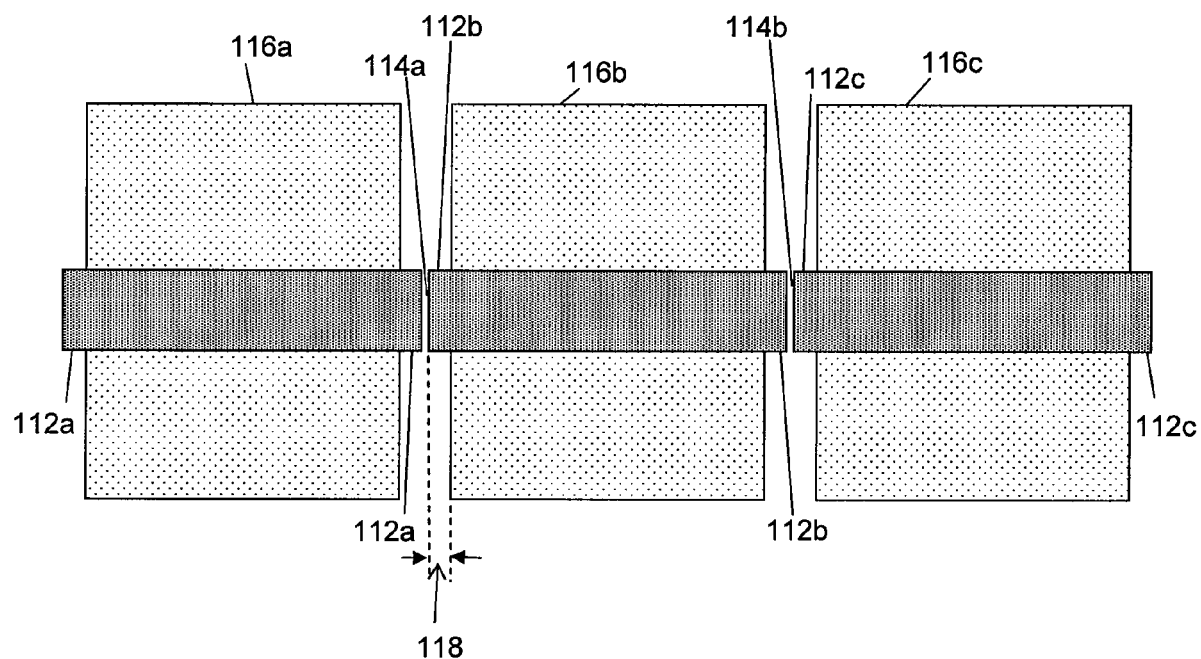
FIG. 1 is a diagram showing lines on a conventional semiconductor circuit in accordance with the prior art.
Figure 2A:
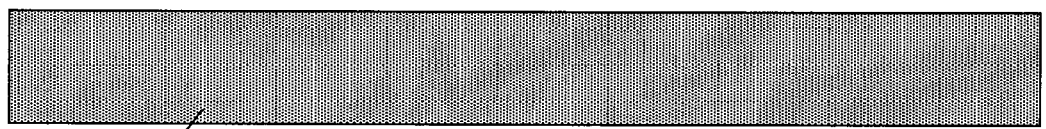
FIG. 2A is a diagram illustrating salient portions of the pattern of the first of a pair of photolithography masks used to pattern features in accordance with a first embodiment of the present invention.
Figure 2B:
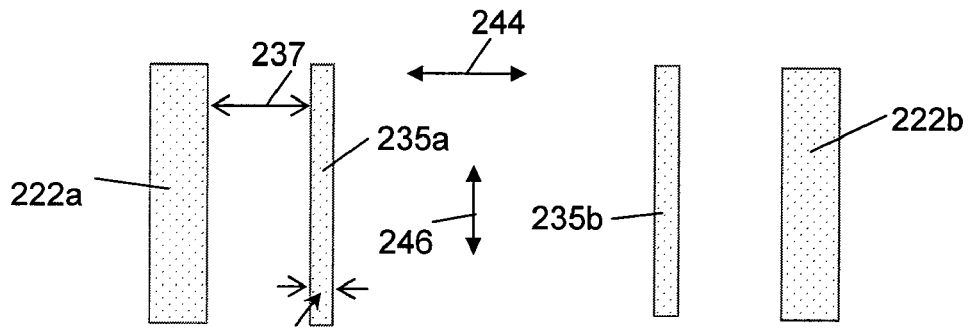
FIG. 2B is a diagram illustrating salient portions of the pattern of the second of the pair of photolithography masks used to pattern features in accordance with the first embodiment of the present invention.
Figure 2C:
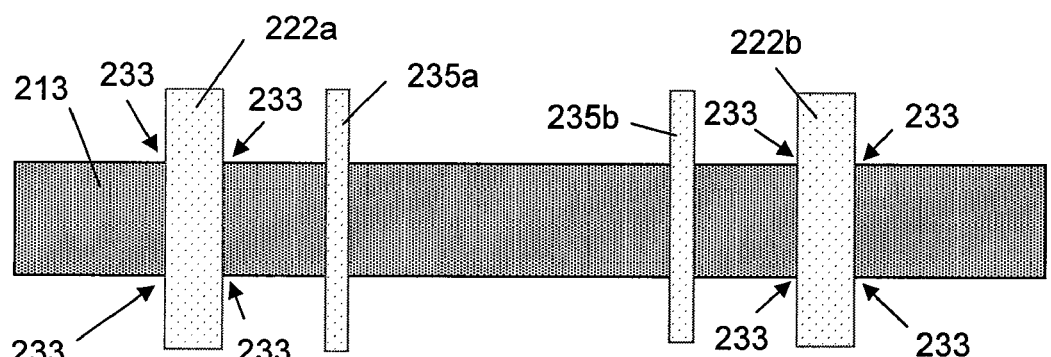
FIG. 2C is a diagram illustrating the pattern of the masks of FIGS. 2A and 2B overlaid on each other.
Figure 2D:
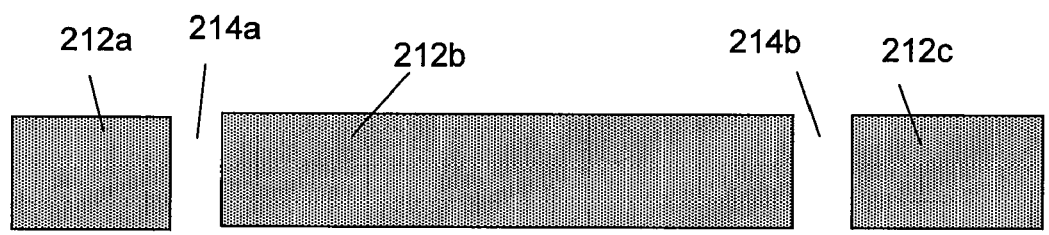
FIG. 2D is a diagram illustrating the lines created in photoresist using the masks of FIGS. 2A and 2B.

For purposes of clarity, a brief discussion of the convention used in the drawings and the terminology used in the written specification is in order. With reference to FIGS. 2A-2D as an example, FIG. 2A illustrates a portion of a first mask, FIG. 2B illustrates a corresponding portion of a second mask, FIG. 2C illustrates the first and second mask portions overlaid on each other, and FIG. 2D illustrates the overall pattern of the lines on the semiconductor substrate at the completion of lithography (and etching) that results from the use of the two masks.

FIG. 2A shows the pattern of the first mask relevant to creating three coaxial adjacent lines (212*a*, 212*b*, 212*c* in FIG. 2D) with two tip to tip gaps (214*a*, 214*b* in FIG. 2D) there between. The dotted portion 213 in FIG. 2A represents the portion of the mask that corresponds to photoresist that will remain on the wafer after development. Thus, in turn, the dotted portion 213 corresponds to the portion of the underlying etchable material that will remain on the wafer after etch. Thus, for instance, if a negative photoresist is used, the dotted portion 213 in FIG. 2A would correspond to the transparent regions of the mask. On the other hand, if positive photoresist is the used, the dotted portion 213 in FIG. 2A would correspond to the opaque portions of the mask.

FIG. 2B illustrates the corresponding portion of the second mask. FIG. 2B illustrates the second mask in the reverse polarity as FIG. 2A. That is, if negative photoresist is used, the dotted portions of 2B correspond to opaque regions of the second mask (whereas, in FIG. 2A, the dotted portions correspond to transparent regions of the first mask). On the other hand, if positive photoresist is used, the dotted portions in FIG. 2B correspond to the transparent regions of the mask (whereas the dotted portions in FIG. 2A correspond to the opaque regions of the first mask). For illustrative purposes, the Figures assume a positive resist. The first mask illustrated in FIG. 2A has positive polarity (i.e., structures correspond to opaque regions of the mask) and the second mask illustrated in FIG. 2B) is of negative polarity (i.e., structures correspond to transparent regions of the mask). The explanation holds true if one uses negative resist and change the polarity of the mask (negative polarity for mask 1 and positive polarity for mask 2). Thus, ignoring the issue of positive photoresist or negative photoresist for the moment, the dotted portions of FIG. 2A correspond to photoresist that will remain, whereas the dotted portions of the second mask shown in FIG. 2B correspond to portions of photoresist that will be removed.

It should be understood that while these figures illustrate only three adjacent lines and the two gaps therebetween, the entire mask typically will include patterning for creating many such lines and gaps per row and many such rows of lines and gaps (as well as substantial amounts of other circuit components that could be created in the same layer as these lines). Furthermore, the invention will be described herein in connection with the creation of lines for SRAM, but this is merely exemplary as the techniques of the present invention for alleviating line end shortening can be applied to other circuit designs (for example, in reducing the pitch of particular features).

Also note that for purposes of ease of reference, in this specification, the term "length" will be used to refer to measurements in the long dimension of the lines as illustrated by double headed arrow 244 in FIG. 2B, while the term "width" will be used to refer to the dimension transverse thereto as illustrated by double headed arrow 246 in FIG. 2B.

Finally, we refer to primarily linear features as "lines" because that is the common terminology in the related trade. However, it should be understood that such lines are actually rectangles having a length and a width. In fact, it should be understood, that, in the broader context of the invention not limited to the particular example of lines described herein, the features or structures being created in or on the wafer are not even necessarily rectangular, but can be of any shape that has an end that might be subject to LES or similar issues. Features in semiconductors generally tend to be rectangular (i.e., comprised of one or more rectangular shapes), but this is not a requirement of semiconductor fabrication or of the present invention.

On the other hand, the features of the masks for creating such lines will herein be referred to as rectangles or shapes since it will be necessary to refer to both their lengths and widths.

Referring to FIG. 2A, the first mask is patterned so as to have one long continuous rectangle 213 corresponding to the length of a plurality of coaxial lines 212*a*, 212*b*, 212*c* with gaps 214*a*, 214*b* therebetween (see FIG. 2D). The rectangle normally should be equal in length to the combined length of the all of the coaxial lines 212, including the gaps 214 therebetween. If the invention is used with negative photoresist, this rectangle 213 would be a transparent island region of the mask. If the invention is used with positive photoresist, this rectangle 213 would be an opaque island region of the mask. The photoresist is then exposed, but is not yet developed.

The second mask illustrated in FIG. 2B is then applied and includes patterning for creating the gaps 214*a*, 214*b* between the lines 212*a*, 212*b*, 212*c*. Accordingly, the pattern of this mask comprises a plurality of rectangles 222*a*, 222*b* of the reverse polarity of rectangle 213 of FIG. 2A and of the length in direction 244 corresponding to the desired tip to tip line spacing (i.e., equal to the length in direction 244 of the gaps 214) and having a width in direction 246 greater than the width of the lines 212. Generally, the length of the rectangles 222*a*, 222*b* in direction 244 should be equal to the gap length. However, more broadly, we use the term "corresponding to" rather than "equal to" because it also might be desirable to make the length slightly different, for instance, so as to compensate for any other process issues such as overlay tolerance/etch trims etc. . . .

The photoresist is exposed again, this time through the second mask. The combined pattern of the two masks of FIGS. 2A and 2B overlaid on each other is shown in FIG. 2C.

After the photoresist has been exposed through both masks, the pattern in the photoresist created collectively by the two masks is then developed. (Note that the order in which the first and second masks are used to expose the photoresist is not critical.) The resist pattern remaining on the wafer after developing will be as shown in FIG. 2D. This photoresist template is now used for etching the desired layer underneath.

The use of two separate masks, the first to pattern the coaxial lines continuously without the tip to tip gaps therebetween and the second to create the gaps substantially reduces or eliminates line end shortening. Specifically, there are no corners in either of the masks corresponding to the corners at the line ends. Rather, there are only straight lines in either of the two masks corresponding to the line ends. Accordingly, corners or other discontinuities in the edges between the opaque and transparent regions of the mask that cause discontinuities leading to undesirable diffraction effects during photolithography are eliminated, thereby substantially reducing line end shortening and eliminating corner rounding.

In accordance with a preferred implementation of the first embodiment of the invention, the second mask further includes sub-resolution assist features (SRAFs) 235*a*, 235*b* to further minimize undesirable diffraction effects at the tips of the lines. As is well-known in the art of photolithography, SRAFs are features, such as rectangles, that are added to a mask pattern at a spacing 237 equivalent to the spacing for which the optics of the system have been optimized, but of a length 238 below the resolution of the system. Since the lengths of the SRAFs are below the resolution of the system, the SRAF will not be printed on the wafer. Nevertheless, the presence of SRAFs close to the tip to tip gaps 214 helps increase the process window at the edges of the rectangles 235 in the second mask.

According to an embodiment of the invention, line end shortening no longer depends substantially on optical proximity/diffraction effects and, thus, photolithography (optical) related line end shortening is substantially eliminated. Furthermore, no extensive optical proximity correction is needed for the line ends. Even further, because the two masks are used immediately after each other on the same tool without wafer movement, tolerances (particularly the overlay tolerance) remain tight. For instance, the overlay tolerance of a typical 193 nm scanner is about 12 nm for mask overlay for the same layer, whereas interlayer overlay tolerances in connection with different masks used for different layers tend to run about twice that.

As previously noted, the figures only illustrate the patterning for the lines. However, it should be understood that the first mask most likely will contain patterning for many other features. However, the second mask can contain only the rectangles for creating the tip to tip gaps (and SRAFs, if desired). Accordingly, the second mask can be an inexpensive chrome-on-glass (COG) mask, rather than the more typical, and much more expensive, phase shifting masks (PSMs) used for patterning circuits. Hence the second mask can be made inexpensively.

Figure 3A:
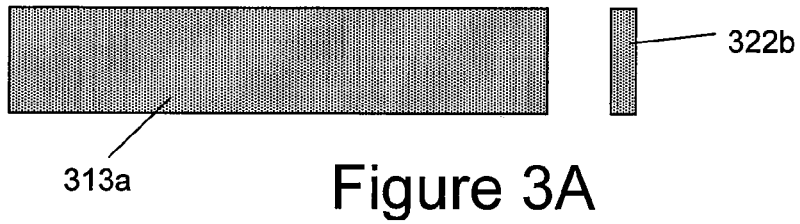
FIG. 3A is a diagram illustrating salient portions of the pattern of the first of a pair of photolithography masks used to pattern features in accordance with a second embodiment of the present invention.
Figure 3B:
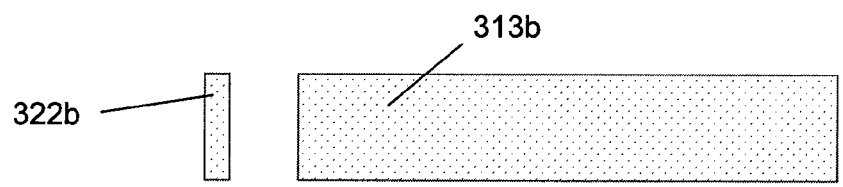
FIG. 3B is a diagram illustrating salient portions of the pattern of the second of the pair of photolithography masks used to pattern features in accordance with the second embodiment of the present invention.
Figure 3C:
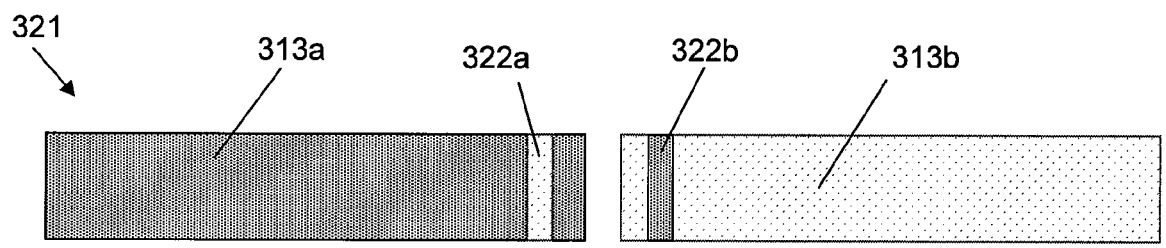
FIG. 3C is a diagram illustrating the pattern of the masks of FIGS. 3A and 3B overlaid on each other.

FIGS. 3A-3D help illustrate an exemplary second embodiment of the present invention. This embodiment also utilizes two separate masks for creating the lines, the pattern of the first mask being illustrated by FIG. 3A, the pattern of the second mask being illustrated by FIG. 3B, the pattern of both masks overlaid with each other being illustrated in FIG. 3C, and the resulting pattern on the photoresist being illustrated in FIG. 3D. FIGS. 3A-3B show the portions of the first and second masks, respectively, corresponding to the creation of two coaxial lines 312a, 312b and the gap 314 there between. In FIGS. 3A and 3B, the dark portions of both the first mask and the second mask are of the same polarity, unlike the convention used in connection with FIGS. 2A and 2B. In accordance with this embodiment, each individual mask includes patterning for creating every other line in a row of lines. Thus, for instance, in any given row of coaxial lines, the first mask includes patterning for creating the first, third, fifth, seventh, etc. lines, while the second mask includes the patterning for creating the second, fourth, sixth, eighth, etc. lines. Therefore, no one mask creates both of the line ends that define a single gap between two coaxial lines. Rather, the line end that forms one edge of every gap is patterned by the first mask and the line end that forms the other edge of that gap is formed by the second of mask.

Figure 3D:
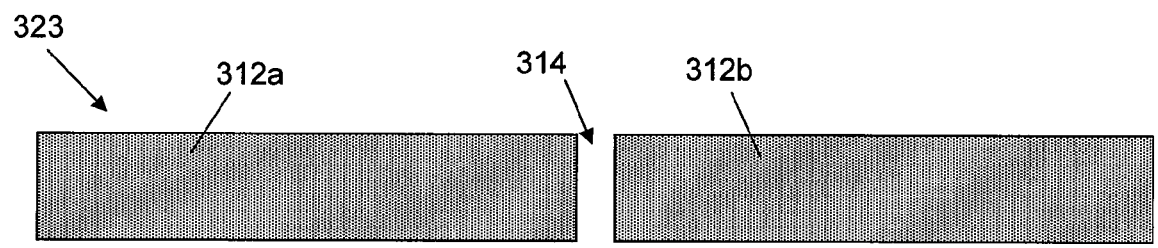
FIG. 3D is a diagram illustrating the lines created in photoresist using the masks of FIGS. 3A and 3B.

With reference to FIG. 3A, the first mask includes a pattern rectangle 313a corresponding to line 312a in the photoresist. With reference to FIG. 3B, the second mask includes a pattern rectangle 313b corresponding to line 312b in the photoresist. Collectively, the masks create the pattern 321 shown in FIG. 3C, which creates a photoresist pattern 323 as shown in FIG. 3D.

Again, this solution has the advantage of minimizing undesirable diffraction effects at the tip to tip gaps.

Furthermore, in a preferred implementation of this embodiment of the invention, SRAFs 322a, 322b are included in the patterns on both masks adjacent the rectangle ends on the masks. This particular embodiment of the invention provides plenty of area for the SRAFs to be placed on the masks. Particularly, each mask has approximately half of the features of the layer. Accordingly, there is substantial room for SRAFs adjacent the rectangle ends on each mask.

In this embodiment, both masks may be phase shifting masks.

With this embodiment, the inclusion of SRAFs permits a larger process window. Also, like the first embodiment described above, another advantage of this embodiment is that tolerances for tip to tip distance is a function of overlay scaling of the two masks only. Therefore, as noted above, tolerances are about 12 nm or smaller because both masks are used in the same machine without moving the wafer.

The two mask concept of this embodiment can be generalized to any feature, not just tip to tip spacing. Particularly, this technique permits each mask to be manufactured to a resolution that is as low as one half the desired resolution of the circuit. This can provide a higher resolution in the creation of the features than can be achieved with a single mask. For instance, if 90 nm resolution is desired, it can be created with two masks, each mask having only 180 nm resolution.

Figure 4A:
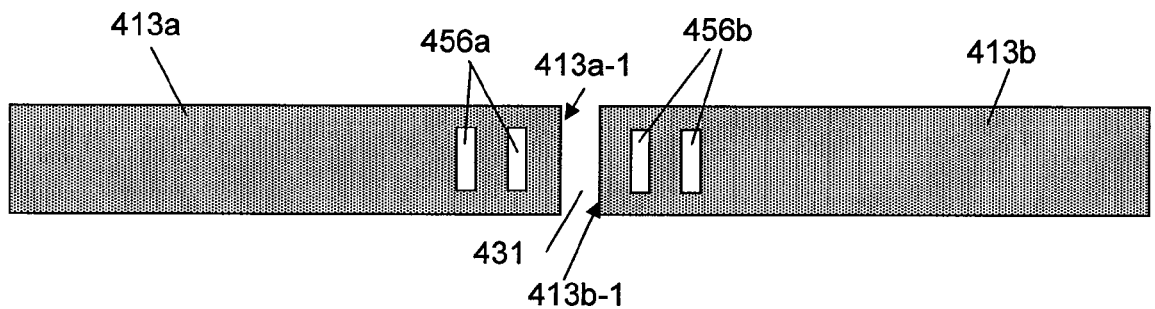
FIG. 4A is a diagram illustrating salient portions of the pattern of an exemplary photolithography mask used to pattern features in accordance with a third embodiment of the present invention.
Figure 4B:
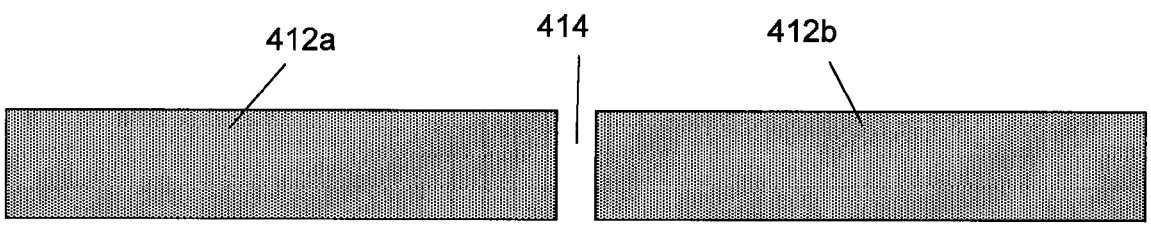
FIG. 4B is a diagram illustrating the lines that would be created in photoresist using the mask of FIG. 4A.

FIGS. 4A and 4B help illustrate a third embodiment of the present invention. Particularly, FIG. 4A illustrates the pattern of a photolithography mask in accordance with this embodiment of the invention, while FIG. 4B illustrates the pattern developed in the photoresist layer from this mask.

In accordance with this embodiment, a single mask is used to create all of the lines, including the gaps there between. The mask includes rectangles 413a, 413b (corresponding to adjacent coaxial lines 412a, 412b in the photoresist) with a gap 431 therebetween (corresponding to gap 414 in the photoresist). It further includes SRAFs 456a, 456b placed within the rectangles, 413a, 413b. These SRAFs are adjacent to the ends of the rectangles in the mask 413a, 413b, respectively, and have a length in the long dimension of the lines below the resolution of the optics of the photolithography system and a width equal to or less than the width of the rectangles 413 within which they are disposed. In this embodiment, they are at a spacing relative to each other and to the tip to tip gap 431 to optimize the optics for the particular photolithography system. The SRAFs 456a in the mask are of the type (transparent or opaque) opposite that of the rectangle within which they are disposed. The SRAFs 456a in rectangle 413a help correct for the diffraction around the end of rectangle 413b by counteracting the diffraction effects of the end edge 413b-1 of rectangle 413b, while the SRAFs 456b in rectangle 413b help correct for the diffraction around the end of rectangle 413a by counteracting the diffraction effects of the end edge 413a-1 of rectangle 413a.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

The invention claimed is:

1. A method for controlling etching during photolithography in the fabrication of features on an integrated circuit, comprising:

depositing a layer of photoresist on the integrated circuit;

selectively exposing portions of the photoresist through a first photolithography mask having a pattern comprising a first shape of a first polarity corresponding to a first feature and a second feature with a gap there between, the first shape having a length in a first direction corresponding to a combined length of the first feature, the gap, and the second feature in the first direction and a width transverse the first direction;

selectively exposing portions of the photoresist through a second mask comprising a pattern for a second shape of a second polarity opposite the first polarity, the second shape positioned to correspond to the gap and having a width transverse the first direction that is greater than the width of the first shape and a length in the first direction corresponding to the length of the gap; and developing the photoresist after the selective exposing steps;

wherein the second mask further comprises at least one third shape of the second polarity parallel to the second shape, the third shape having a length transverse the first dimension less than a resolution of a photolithography system used in connection with the first and second masks.

2. The method of claim 1 wherein the integrated circuit is a Static Random Access Memory (SRAM) and wherein the first and second shapes comprise lines of transistors of the SRAM.

3. A method for controlling etching during photolithography in the fabrication of features on an integrated circuit comprising:

depositing a layer of photoresist on the integrated circuit;

selectively exposing portions of the photoresist through a first photolithography mask comprising a pattern including a first shape corresponding to a first feature of the integrated circuit and not including a shape corresponding to a second feature of the integrated circuit, the first shape having a length in a first direction corresponding to a length of the first shape in the first direction and a width transverse the first direction;

selectively exposing portions of the photoresist through a second photolithography mask comprising a pattern including a second shape corresponding to the second feature and not including a shape corresponding to the first feature, the second shape having a length in the first direction corresponding to a length of the second feature in the first direction and a width transverse the first direction; and developing the photoresist after the selective exposing steps.

4. The method of claim 3 wherein the first feature and the second feature are adjacent to each other and have a gap there between.

5. The method of claim 3 wherein the integrated circuit is a Static Random Access Memory (SRAM) and wherein the first and second features comprise lines of transistors of the SRAM.

6. The method of claim 3 wherein the first shape of the first mask has an end corresponding to an end of the first feature adjacent a gap between the first feature and the second feature and wherein the second shape of the second mask has an end corresponding to an end of the second feature adjacent the gap and wherein each first and second masks further comprise at least one sub-resolution assist feature (SRAF).

7. The method of claim 6 wherein the SRAF on the first mask comprises a third shape adjacent the first shape, the third shape having a length in the first direction that is less than a resolution of a photolithography system used in connection with the first and second masks and a width transverse the first direction and the SRAF on the second mask comprises a fourth shape adjacent the second shape, the fourth shape having a length in the first direction less than the resolution of the photolithography system and a width transverse the first direction.

8. A method for controlling etching during photolithography in the fabrication of an integrated circuit comprising:

depositing a layer of photoresist on the integrated circuit;

selectively exposing portions of the photoresist through a photolithography mask comprising a pattern corresponding to a first feature and a second feature and a gap therebetween on the integrated circuit, the pattern comprising first and second shapes, each comprising a first one of an opaque region and a transparent region corresponding to the first and second features, respectively, and a region comprising a second one of an opaque region and a transparent region corresponding to the gap, the pattern further comprising at least one SRAF within each of the first and second shapes, the SRAF comprising a region of the second one of an opaque region and a transparent region; and developing the photoresist after the selective exposing steps.

9. A method for controlling etching during photolithography in the fabrication of an integrated circuit in connection with first and second features having a gap there between that are to be formed on the integrated circuit, comprising:

depositing a layer of photoresist on the integrated circuit;

selectively exposing portions of the photoresist through at least one photolithography mask, the at least one photolithography mask comprising a pattern including means for alleviating line end shortening of the first and second lines adjacent the gap; and developing the photoresist after the selective exposing step;

wherein the at least one photolithography mask comprises first and second masks and the means for alleviating line end shortening comprises a pattern on the first mask including a first shape corresponding to the first feature and not including a shape corresponding to the second feature, the first shape having a length in a first direction corresponding to the length of the first feature and a width transverse the first direction and a pattern on the second mask including a second shape corresponding to the second feature and not including a shape corresponding the first feature, the second shape having a length in the first direction corresponding to a length of the second feature and a width transverse the first direction.

10. The method of claim 9 wherein the integrated circuit is a Static Random Access Memory (SRAM) and wherein the first and second lines on the integrated circuit comprise gate electrodes for transistors of the SRAM.

11. A method for controlling etching during photolithography in the fabrication of an integrated circuit in connection with first and second features having a gap there between that are to be formed on the integrated circuit, comprising:

depositing a layer of photoresist on the integrated circuit;

selectively exposing portions of the photoresist through at least one photolithography mask, the at least one photolithography mask comprising a pattern including means for alleviating line end shortening of the first and second lines adjacent the gap; and developing the photoresist after the selective exposing step;

wherein the means for alleviating line end shortening comprises a pattern corresponding to the first and second features and the gap on the integrated circuit, the pattern comprising first and second shapes, each comprising a first one of an opaque region and a transparent region corresponding to the first and second features, respectively, and a region comprising a second one of an opaque region and a transparent region corresponding to the gap, the pattern further comprising at least one SRAF within each of the first and second shapes, the SRAF comprising a region of the second one of an opaque region and a transparent region.

12. The method of claim 11 wherein the SRAF comprises at least one shape having a length in the first direction that is less than a resolution of a photolithography system used in connection with the mask.

* * * * *